United States Patent
Tsai

(10) Patent No.: US 7,951,644 B2
(45) Date of Patent: May 31, 2011

(54) SEMICONDUCTOR DEVICE AND METHOD FOR FABRICATING THE SAME

(75) Inventor: Shiann-Tsong Tsai, Hsinchu (TW)

(73) Assignee: United Test Center Inc., Hsinchu (TW)

( * ) Notice: Subject to any disclaimer, the term of this patent is extended or adjusted under 35 U.S.C. 154(b) by 0 days.

(21) Appl. No.: 12/579,748

(22) Filed: Oct. 15, 2009

(65) Prior Publication Data

US 2010/0148361 A1    Jun. 17, 2010

(30) Foreign Application Priority Data

Dec. 17, 2008    (TW) ............... 97149097 A

(51) Int. Cl.
 *H01L 21/44* (2006.01)
 *H01L 21/48* (2006.01)
 *H01L 21/50* (2006.01)
(52) U.S. Cl. ......... 438/106; 438/118; 438/119; 438/612
(58) Field of Classification Search ............ 438/106, 438/118, 612, 613, 614, 124, 126, 127, 119
See application file for complete search history.

(56) References Cited

U.S. PATENT DOCUMENTS

| | | | |
|---|---|---|---|
| 2005/0136635 A1* | 6/2005 | Savastiouk et al. | 438/597 |
| 2007/0045836 A1* | 3/2007 | Kwon et al. | 257/734 |

* cited by examiner

*Primary Examiner* — Chuong A. Luu
(74) *Attorney, Agent, or Firm* — Peter F. Corless; Steven M. Jensen; Edwards Angell Palmer & Dodge LLP

(57) ABSTRACT

A semiconductor device and a method for fabricating the same, including: a substrate having a mounting surface formed with a plurality of bonding fingers and covered with an insulating layer, the insulating layer having an opening formed therein for exposing the bonding fingers; and a chip coupled to the substrate and including a body, a self-adhesive protective layer, and a plurality of bumps protruding from the self-adhesive protective layer. The self-adhesive protective layer is formed on the chip but leaves the bumps exposed. The self-adhesive protective layer is made of a photosensitive adhesive, thermosetting adhesive, or dielectric material. The chip is coupled to the substrate via the self-adhesive protective layer, thus allowing the bumps to be electrically connected to the bonding fingers and at least an end of the opening to be exposed. The method enables a more streamlined manufacturing process and lower fabrication costs by dispensing with adhesive dispensing.

14 Claims, 6 Drawing Sheets

SEMICONDUCTOR DEVICE AND METHOD FOR FABRICATING THE SAME

BACKGROUND OF THE INVENTION

1. Field of the Invention

The present invention relates to semiconductor devices and methods for fabricating the same, and more particularly, to a flip-chip semiconductor device and a method for fabricating the same.

2. Description of Related Art

Modern semiconductor manufacturers usually use flip-chip packages in fabricating electronic devices that need to be made thin and miniaturized. Flip-chip packaging involves electrically connecting a bond pad-mounted surface of a chip to bond pads formed on a substrate via bumps and then encapsulating the chip with an encapsulant.

A conventional method for fabricating a flip-chip package is illustrated in FIG. 1A through FIG. 1D.

Referring to FIG. 1A, a substrate 1 has a mounting surface 10 formed with a plurality of bond pads 11 thereon, and a chip 2 has a first surface 20 formed with a plurality of bumps 22 thereon, wherein the bumps 22 correspond to the bond pads 11.

Referring to FIG. 1B, the first surface 20 of the chip 2 is positioned to face the mounting surface 10 of the substrate 1, allowing the bumps 22 to be electrically connected to the corresponding bond pads 11.

Upon completion of the step of electrical connection of the bumps 22 and the bond pads 11 corresponding in position thereto, an underfill operation is performed on the substrate 1 and the chip 2 thereon. Referring to FIG. 1C, a filler 23 is disposed between the mounting surface 10 of the substrate 1 and the first surface 20 of the chip 2 such that the gap between the substrate 1 and the chip 2 and the space surrounding the bumps 22 are filled in with the filler 23.

Referring to FIG. 1D, an encapsulant 24 is formed on the mounting surface 10 of the substrate 1 and a second surface 21 of the chip 2 by molding so as for the chip 2 to be encapsulated by the encapsulant 24.

As described, the conventional method for fabricating a flip-chip package structure involves electrically connecting the chip 2 to the bond pads 11 of the substrate 1 via the bumps 22, thereby effecting electrical connection of the package structure. However, in that the conventional method entails performing the underfill operation in order to couple the chip and the substrate together, the fabrication of the flip-chip package is complex and the efficiency of the fabrication process thereof is compromised.

Hence, it has become a critical issue to streamline the fabrication process of the flip-chip package structure to simply fabrication and cut processing costs.

SUMMARY OF THE INVENTION

In view of the drawback of the prior art, the present invention provides a method for fabricating a semiconductor device, wherein a chip having a self-adhesive protective layer and a substrate having an opening corresponding in position thereto are used in fabricating the semiconductor device.

The method comprises the steps of: providing a chip and a substrate, the chip comprising a body having a first surface and an opposing second surface; a plurality of bumps formed on the first surface of the chip; and a self-adhesive protective layer formed on the first surface and leaving the bumps exposed, the bumps protruding from the self-adhesive protective layer, wherein the self-adhesive protective layer is made of a photosensitive adhesive, a thermosetting adhesive, or an dielectric material, and the substrate comprising a mounting surface formed with a plurality of bonding fingers thereon and covered with an insulating layer thereon, the insulating layer having an opening formed therein to expose the bonding fingers; and laminating the chip and the substrate to each other, thereby allowing the chip to be coupled to the substrate via the self-adhesive protective layer, the bumps to be electrically connected to the bonding fingers, and at least an end of the opening to be exposed. The dimensions of the opening match the chip such that the self-adhesive protective layer formed on the chip does not completely cover the opening when the chip overlying the opening is positioned at a predetermined position above the opening.

The chip and the substrate are laminated together by irradiation lamination, heat lamination, or thermal/sound wave lamination, to allow the chip to be coupled to the substrate via the self-adhesive protective layer and allow the bumps of the chip to be electrically connected to the bonding fingers of the substrate. The process step of irradiation lamination, heat lamination, or thermal/sound wave lamination allows the photosensitive adhesive of the self-adhesive protective layer, the thermosetting adhesive of the self-adhesive protective layer, or the self-adhesive protective layer itself to fully enter the so-called C-stage of complete polymerization. If the self-adhesive protective layer does not completely fill the opening, adhesive dispensing is required as needed, that is, filling the opening completely with adhesive by capillarity so as to reinforce bonding between the chip and the substrate and to protect the bumps.

In view of the aforesaid method, the present invention further provides a semiconductor device comprising a substrate, a chip, and adhesive. The substrate has a mounting surface formed with a plurality of bonding fingers and is partly covered with an insulating layer thereon, wherein the insulating layer has an opening formed therein to expose the bonding fingers. The chip has a first surface and an opposing second surface. A plurality of bumps is formed on the first surface of the chip. A self-adhesive protective layer is formed on the first surface and leaves the bumps exposed and protruding from the self-adhesive protective layer. The self-adhesive protective layer is made of a photosensitive adhesive, a thermosetting adhesive, or a dielectric material. The chip is coupled to the substrate via the self-adhesive protective layer, thereby allowing the bumps to be electrically connected to the bonding fingers and exposed from at least a side of the opening.

In a preferred embodiment, the semiconductor device further comprises an adhesive formed in the opening formed in the insulating layer so as to encapsulate the bumps and the bonding fingers.

Accordingly, the present invention proposes coupling a chip and a substrate together by a self-adhesive protective layer so as to streamline processing, including the step of coupling the chip and substrate together during a packaging process, in order to reduce fabrication costs.

BRIEF DESCRIPTION OF THE DRAWINGS

FIG. 2I is a cross-sectional view showing the semiconductor device obtained by the method for fabricating a semiconductor device according to the present invention;

DETAILED DESCRIPTION OF PREFERRED EMBODIMENTS

The present invention is herein illustrated with specific embodiments, so that one skilled in the pertinent art can readily understand other advantages and effects of the present invention from the disclosure of the invention. The present invention can also be implemented or applied using other differing specific embodiments. Also, various modifications and changes from different points of view or for different applications can be made to the details described in the specification without departing from the spirit of the present invention. As such, the following preferred embodiments are intended for detailed description of the present invention rather than restriction of the scope of the present invention.

FIGS. 2A through 2H provide various views of a method for fabricating a semiconductor device of the present invention.

Figure 1A:
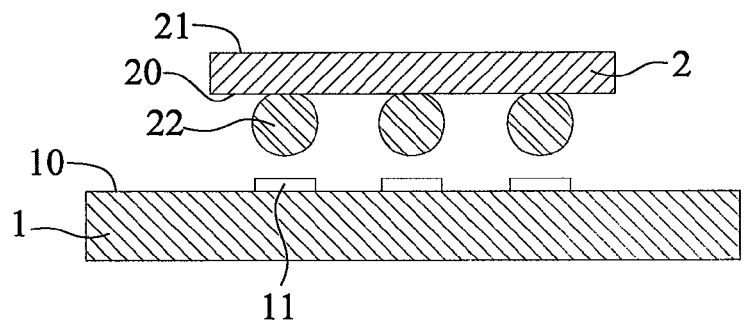
FIGS. 1A through 1D are cross-sectional views of the conventional fabrication steps for flip-chip packaging.
Figure 1B:
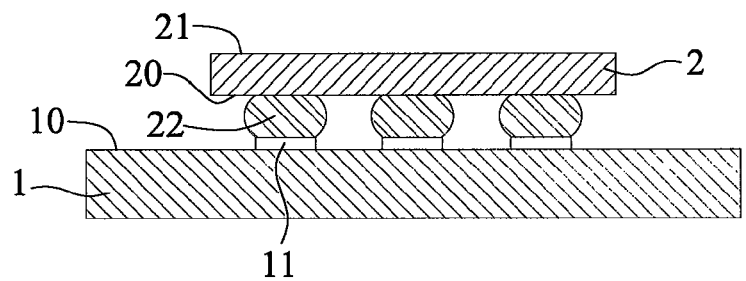
Figure 1C:
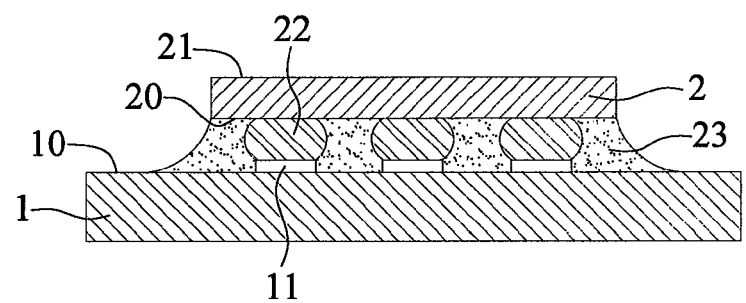
Figure 1D:
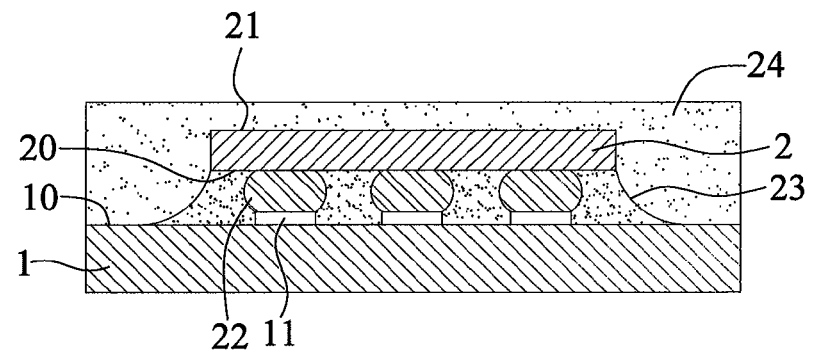
Figure 2A:
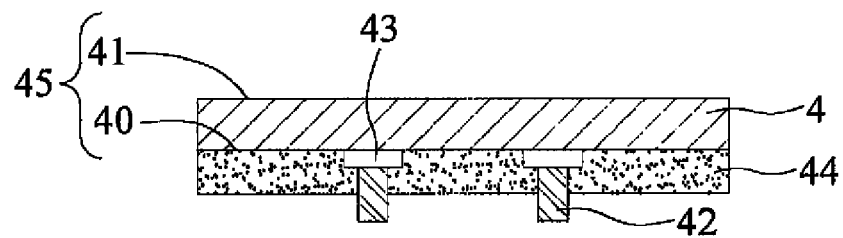
FIGS. 2A through 2I are cross-sectional and top views of a method for fabricating a semiconductor device of the present invention, with FIGS. 2B', 2G and 2H showing various top views showing details of the fabrication process.
Figure 2B:
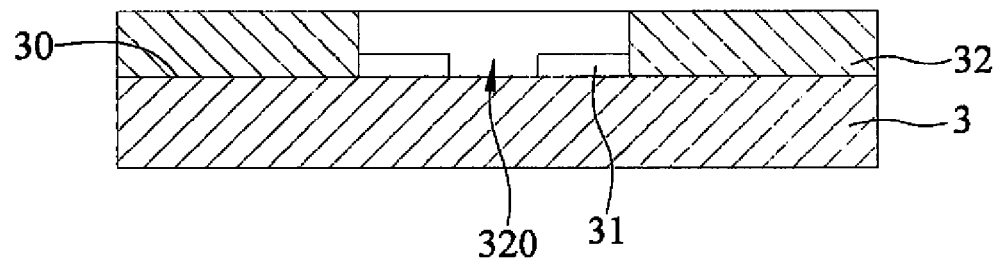
Figure 2B:
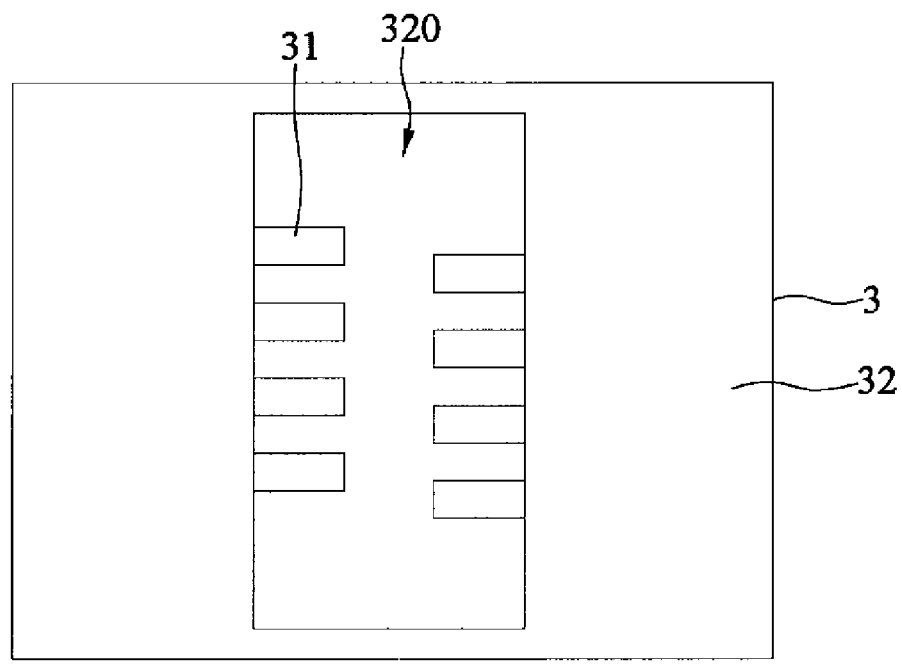

Referring to FIGS. 2A and 2B, a chip 4 and a substrate 3, both furnished with a circuit layout, are provided.

In FIG. 2A, the chip 4 comprises a body 45 having a first surface 40 and an opposing second surface 41, wherein a plurality of pads 43 is formed on the first surface 40 to accommodate a plurality of corresponding bumps 42. Also, a self-adhesive protective layer 44 is formed on the first surface 40. The formation of the self-adhesive protective layer 44 is not finalized until a plurality of holes to expose the pads 43 is formed in the self-adhesive protective layer 44, thus allowing said bumps 42 to be formed on the first surface 40 and protrude from the self-adhesive protective layer 44.

In FIG. 2B, the substrate 3 has a mounting surface 30 provided with a plurality of bonding fingers 31 thereon and covered with an insulation layer 32 thereon. The insulation layer 32 has an opening 320 formed therein to expose the bonding fingers 31. The opening 320 is configured for two purposes: electrical connection of the chip 4 and the substrate 3 and receipt of a portion of the self-adhesive protective layer 44 (after bonding) and an adhesive 6' subsequently provided. Normally, a dimension of the opening 320 is greater than a dimension of the chip 4 such that, upon the coupling of the chip 4 and the substrate 3 to each other, at least an end of the opening 320 is exposed. Referring to FIG. 2G, for example, the opening 320 is longer than the sides of the chip 4, and, preferably, two opposite ends of the opening 320 are exposed when the chip 4 is mounted on the substrate 3.

The bumps 42 whereby the chip 4 and the substrate 3 are electrically connected to each other are made of a conductor selected from the group consisting of aluminum, copper, titanium, tin, lead, gold, bismuth, zinc, nickel, zirconium, magnesium, indium, antimony, tellurium, and a combination thereof.

In a preferred embodiment, the self-adhesive protective layer 44 is made of a material including, but not limited to, a photosensitive adhesive, a thermosetting adhesive, or a dielectric material. The photosensitive adhesive is a photoresist material suitable for a photolithography process, such as a UV-absorbing polyacrylate photoresist agent or any photocurable photoresist material. In the case that the self-adhesive protective layer 44 is made of a photosensitive adhesive, the self-adhesive protective layer 44 is effective in forming holes and forming bumps corresponding in position thereto by a photolithography process. Upon completion of the photolithography process, the photosensitive adhesive enters B-stage, described later. Examples of the thermosetting adhesive are: epoxy resin, and any material that can be heat-cured and is miscible with a photosensitive adhesive. As was the case for the photosensitive adhesive, the thermosetting adhesive can enter B-stage as needed, depending on the property of the thermosetting adhesive. The dielectric material is polyimide, silicon dioxide, nitrosilicide, or a combination thereof.

Figure 2C:
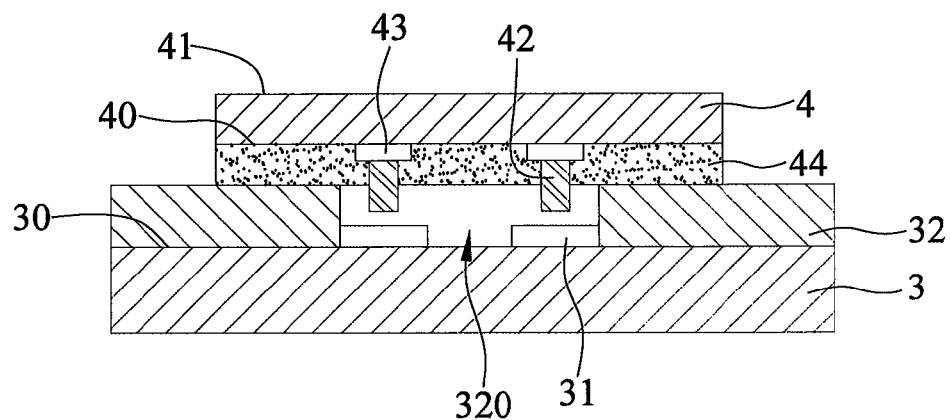
Figure 2D:
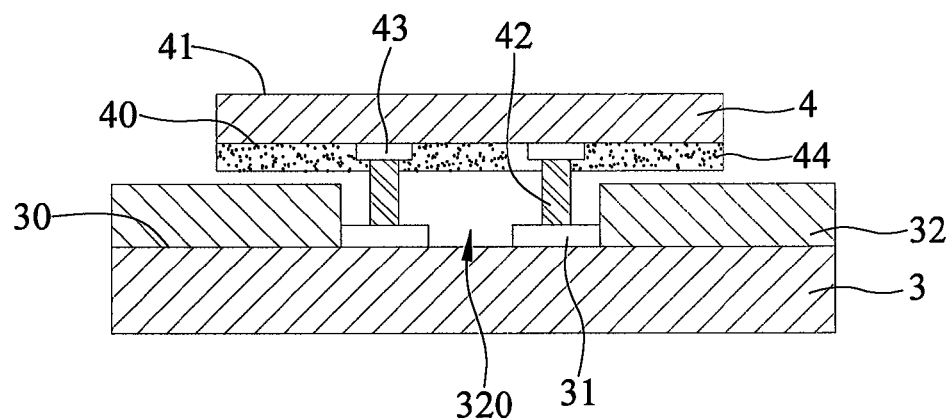
Figure 2E:
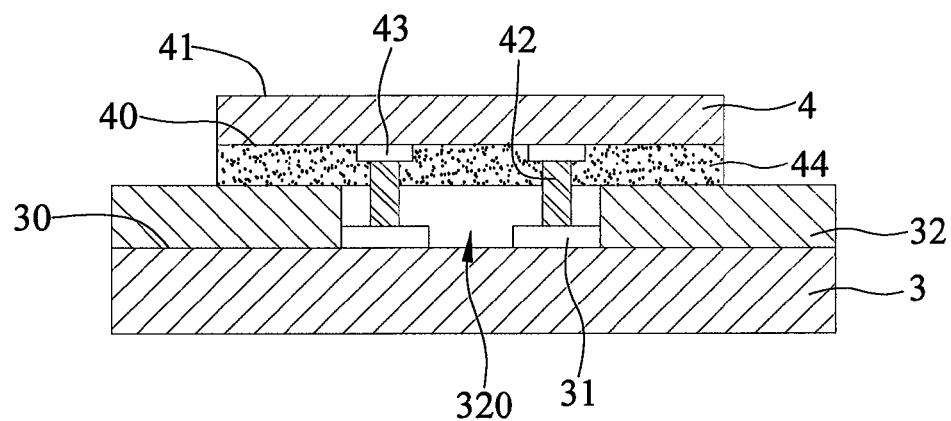

Referring to FIG. 2C, the chip 4 is positioned on the substrate 3, and the bumps 42 of the chip 4 correspond in position to the bonding fingers 31 of the substrate 3. As shown in the drawing, the self-adhesive protective layer 44 on the chip 4 is in contact with the insulating layer 32 on the substrate 3, but the bumps 42 are not in contact with the corresponding bonding fingers 31. Alternatively, as shown in FIG. 2D, the bumps 42 are in partial contact with the corresponding bonding fingers 31, but the self-adhesive protective layer 44 is not in contact with the insulating layer 32. Referring to FIG. 2E, normally, prior to the coupling of the chip and the substrate to each other, the height of a protruding portion of the bumps 42 below the self-adhesive protective layer 44 is determined and controlled so as to ultimately ensure contact between the bumps 42 and the bonding fingers 31 corresponding in position thereto as well as contact between the self-adhesive protection layer 44 and the insulating layer 32 when the chip 4 is mounted on the substrate 3.

Regardless of which pre-lamination state shown in FIG. 2C, 2D, or 2E is used, the chip 4 and the substrate 3 are laminated onto each other by irradiation lamination, heat lamination, or thermal/sound wave lamination, to either allow the photosensitive adhesive or the thermosetting adhesive to enter C-stage or allow the self-adhesive protective layer 44 to enter the C-stage and firmly adhere to the substrate 3 in order to allow electrical connection of the bumps 42 and the bonding fingers 31. The dielectric material of which the self-adhesive protective layer 44 is made is selectively a material miscible with the chip 4 or the substrate 3 so as to enhance the bonding between the self-adhesive protective layer 44 and the chip 4 or the substrate 3.

B-stage refers to the situation where the rate of conversion of a material or adhesive in a reaction is below 80%; preferably, the rate of conversion of the material or adhesive in a reaction is between 35% and 80%. Regarding the rate of conversation, 35% to 80% of the cross-linkable functional groups of the compound undergo a cross-linking reaction to render the material or adhesive sticky. "Photosensitive adhesive at B-stage" refers to the situation where 35% to 80% of the cross-linkable functional groups of the photosensitive adhesive undergo cross-linking reaction. The C-stage of the present invention refers to the situation where the rate of conversion of a material or adhesive in a reaction is between 80% and 100%, and preferably, between 90% and 100%.

Figure 2F:
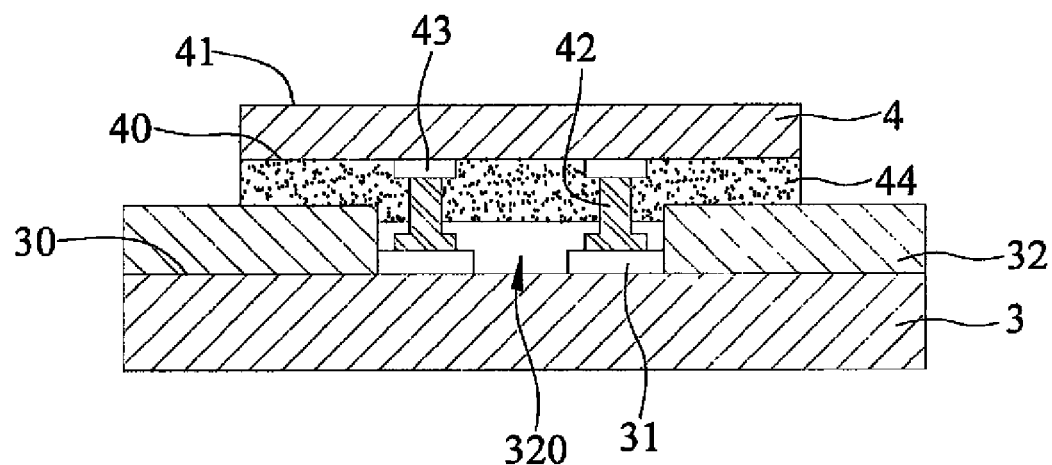
Figure 2G:
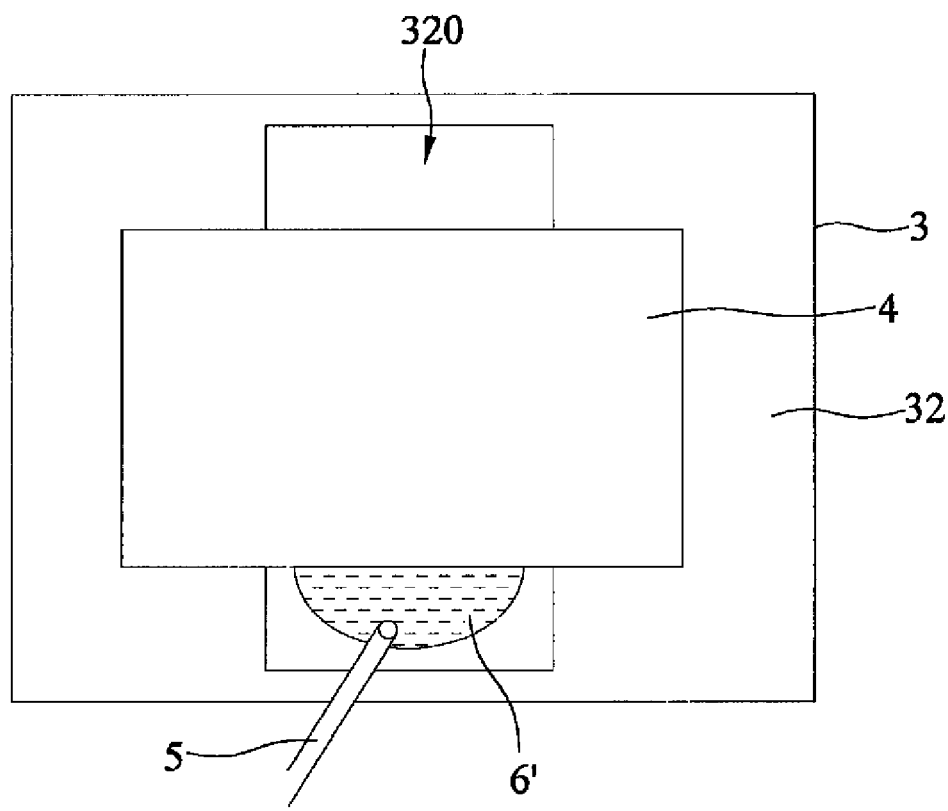

Referring to FIG. 2F, after lamination, the self-adhesive protective layer 44 adheres to the insulating layer 32 of the substrate 3 and fills a portion of the opening 320, but does not completely fill the opening 320. In other words, a portion of the self-adhesive protective layer 44 protrudes into the opening 320, extending to upper sidewalls of the opening 320.

Figure 2H:
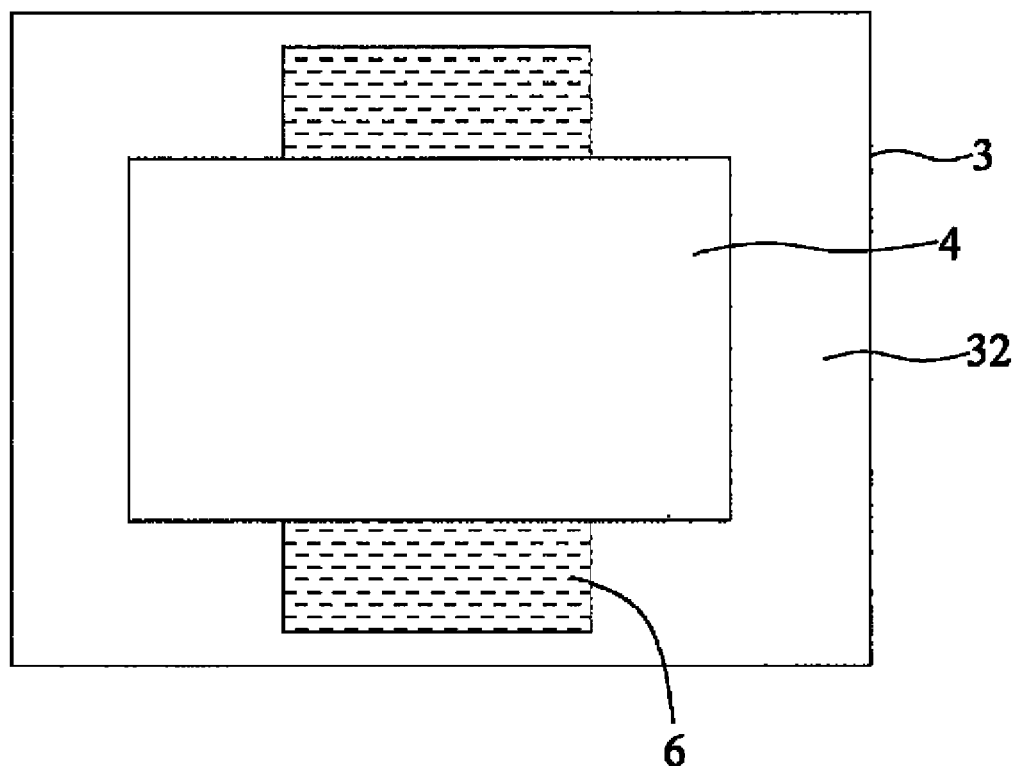

Referring to FIG. 2G, an adhesive dispensing operation is carried out to reinforce bonding between the chip 4 and the substrate 3 and protect the bumps 42 and the bonding fingers 31. As shown in the drawing, after the chip 4 and the substrate 3 have been laminated to each other, the adhesive 6' is dispensed into the opening 320 beginning from an end thereof, and then the adhesive 6' spreads between the chip 4 and the substrate 3 by capillary action to fully fill the opening 320, as shown in FIG. 2H.

Figure 2I:
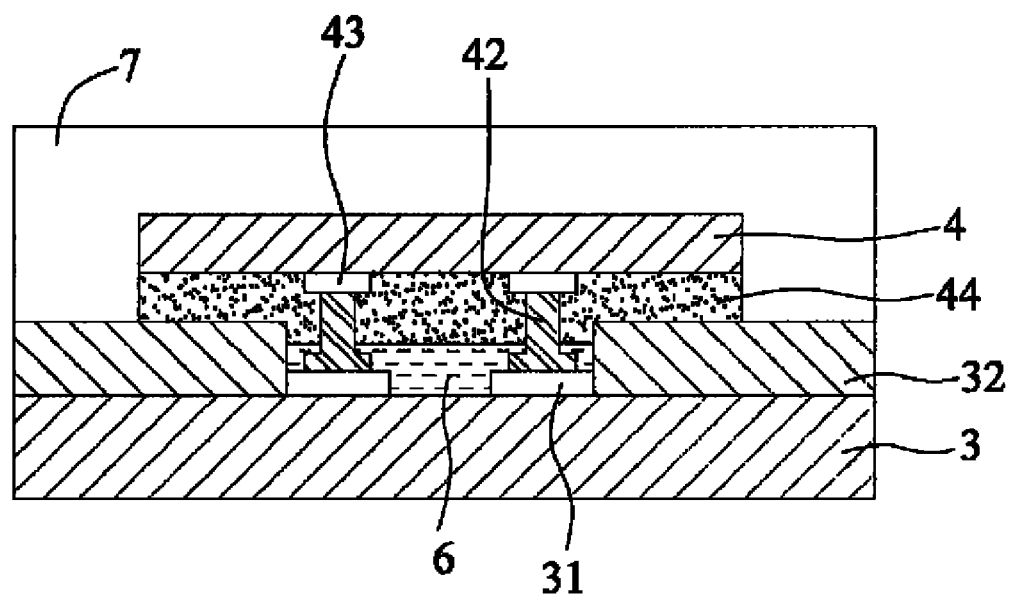

Referring to FIG. 2I, the step of forming an adhesive in the opening formed in the insulating layer so as to encapsulate the plurality of bumps and bonding fingers is followed by a molding operation whereby an encapsulant is formed on the insulating layer so as to encapsulate the chip.

Figure 3:
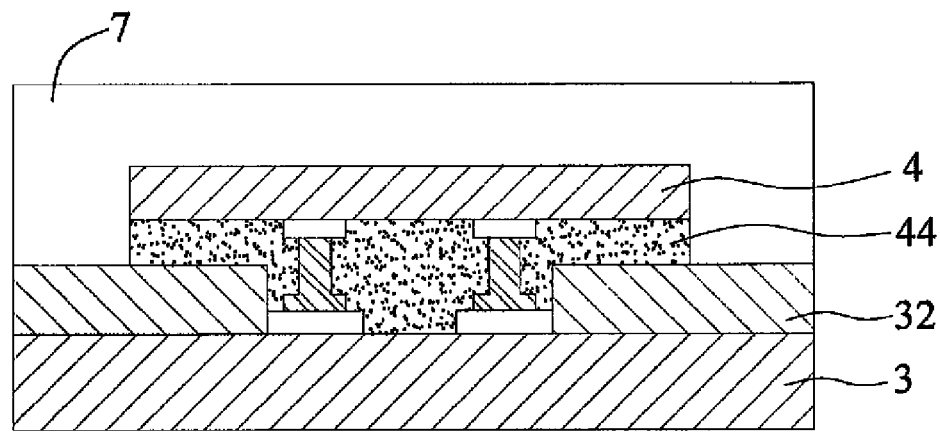
FIG. 3 shows a cross-sectional view of another semiconductor device obtained by the method for fabricating a semiconductor device according to the present invention.

The step of adhesive dispensing can be omitted from the method for fabricating a semiconductor device according to the present invention as appropriate. For example, in a preferred embodiment shown in FIG. 3, during the step of lamination, the opening 320 is filled with the self-adhesive protective layer 44; hence, the subsequent step of molding is not preceded by the step of adhesive dispensing. In the preferred embodiment, the omission of the step of adhesive dispensing intentionally leaves the two ends of the opening 320 exposed from the chip 4 overlying the opening 320 to prevent a mechanical connection-destabilizing defects, such as bubbles, from occurring in the course of filling the opening 320 with the self-adhesive protective layer 44, as gas can be readily discharged from the opening 320 through the two exposed ends thereof. Furthermore, since a photosensitive adhesive and/or a thermosetting adhesive of the self-adhesive protective layer 44 have/has entered B-stage, the self-adhesive protective layer 44 becomes so adhesive that roughening is not required for the mounting surface 30 of the substrate 3, thereby further streamlining the process.

Figure 4A:
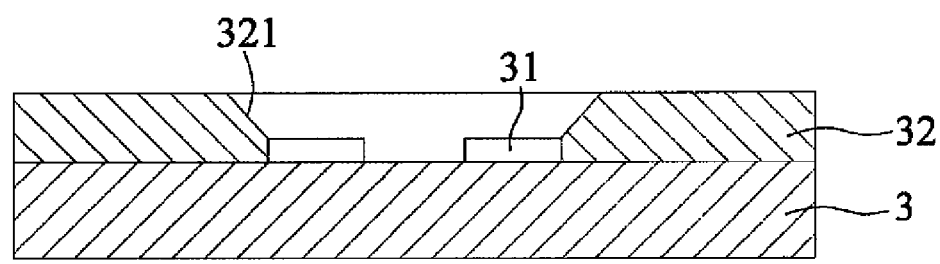
FIGS. 4A and 4B are cross-sectional views of the substrate having two other configurations according to the present invention.
Figure 4B:
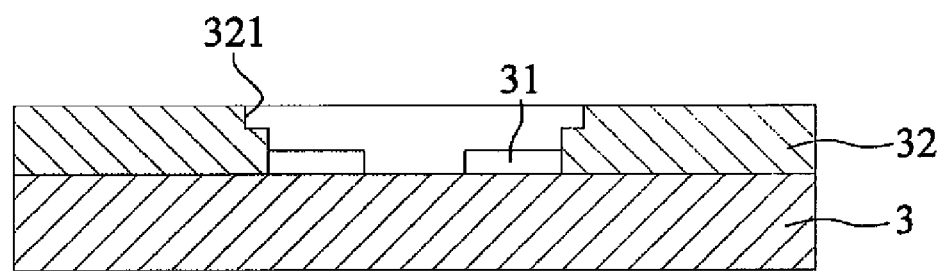

Referring to FIGS. 4A and 4B, the side of the opening 320 formed in the insulating layer 32 on the substrate 3 is inclined or stepped so as to allow the adhesive 6' to encapsulate the bumps 42 and the bonding fingers 31 upon lamination.

The method is particularly applicable to Double Data Rate Dynamic Random Access Memory (DDR DRAM), DDR III and DDR IV.

In conclusion, the present invention proposes: adhering a chip to a substrate by a self-adhesive protective layer made of a photosensitive adhesive, a thermosetting adhesive, or a dielectric material; connecting electrically a plurality of bumps to the chip and the substrate; filling an adhesive between the chip and the substrate as needed by adhesive dispensing so as to fully fill the opening with the adhesive, thereby dispensing with a large-scale adhesive dispensing operation which might otherwise be required to adhere the chip in position. Compared to a conventional flip-chip packaging process, the process performed according to the present invention is fit for mass production, cost-efficient, and capable of streamlining the substrate-chip coupling operation.

The foregoing specific embodiments are illustrative of the features and functions of the present invention but are not intended to restrict the scope of the present invention. It should be apparent to those skilled in the art that equivalent modifications and variations made in the foregoing embodiments according to the spirit and principle in the disclosure of the present invention fall within the scope of the appended claims.

What is claimed is:

1. A method for fabricating a semiconductor device, comprising the steps of:
   (a) providing a chip and a substrate, the chip comprising:
      a body having a first surface and an opposing second surface;
      a plurality of bumps formed on the first surface; and
      a self-adhesive protective layer formed on the first surface of the chip and leaving the bumps exposed, the bumps protruding from the self-adhesive protective layer, wherein the self-adhesive protective layer is made of a photosensitive adhesive, a thermosetting adhesive, or a dielectric material, the substrate having a mounting surface formed with a plurality of bonding fingers thereon and covered with an insulating layer thereon, the insulating layer having an opening formed therein to expose the bonding fingers; and
   (b) laminating the chip and the substrate to each other, thereby allowing the self-adhesive protective layer to fill the opening, the chip to be coupled to the substrate via the self-adhesive protective layer, the bumps to be electrically connected to the bonding fingers, and at least an end of the opening to be exposed.

2. The method of claim 1, wherein the self-adhesive protective layer partly extends to an upper sidewall of the opening.

3. The method of claim 1, further comprising, upon lamination of the chip and the substrate to each other, providing an adhesive from an end of the opening, spreading the adhesive across the opening between the chip and the substrate, and encapsulating the bumps and the bonding fingers with the adhesive.

4. The method of claim 2, further comprising, upon lamination of the chip and the substrate to each other, providing an adhesive from an end of the opening, spreading the adhesive across the opening between the chip and the substrate, and encapsulating the bumps and the bonding fingers with the adhesive.

5. The method of claim 1, further comprising forming on the insulating layer an encapsulant for encapsulating the chip.

6. The method of claim 3, further comprising forming on the insulating layer an encapsulant for encapsulating the chip.

7. The method of claim 1, wherein the photosensitive adhesive is cured.

8. The method of claim 1, wherein the dielectric material is a substance selected from the group consisting of polyimide, silicon dioxide, nitrosilicide, and a combination thereof.

9. The method of claim 1, wherein the lamination type is one selected from the group consisting of irradiation lamination, heat lamination, and thermal/sound wave lamination.

10. The method of claim 3, wherein the lamination type is one selected from the group consisting of irradiation lamination, heat lamination, and thermal/sound wave lamination.

11. The method of claim 1, wherein the bumps are made of a conductive material selected from the group consisting of aluminum, copper, titanium, tin, lead, gold, bismuth, zinc, nickel, zirconium, magnesium, indium, antimony, tellurium, and a combination thereof.

12. The method of claim 3, wherein the bumps are made of a conductive material selected from the group consisting of aluminum, copper, titanium, tin, lead, gold, bismuth, zinc, nickel, zirconium, magnesium, indium, antimony, tellurium, and a combination thereof.

13. The method of claim 1, wherein the thermosetting adhesive is cured.

14. The method of claim 3, wherein the thermosetting adhesive is cured.

* * * * *